United States Patent [19]
Niino et al.

[11] Patent Number: 5,500,388
[45] Date of Patent: Mar. 19, 1996

[54] HEAT TREATMENT PROCESS FOR WAFERS

[75] Inventors: Reiji Niino, Kofu; Tomoyuki Ohbu; Hiroaki Ikegawa, both of Nirasaki; Ken Nakao, Sagamihara; Yoshiyuki Fujita, Kofu; Tsutomu Haraoka; Makoto Kobayashi, both of Sagamihara; Naoya Kaneda, Machida; Hiroshi Kumada, Yokohama, all of Japan

[73] Assignees: Tokyo Electron Kabushiki Kaisha, Tokyo; Tokyo Electron Tohoku Kabushiki Kaisha, Iwate, both of Japan

[21] Appl. No.: 202,457

[22] Filed: Feb. 28, 1994

[30] Foreign Application Priority Data

Jun. 30, 1993 [JP] Japan .................................. 5-216823
Jun. 30, 1993 [JP] Japan .................................. 5-216824

[51] Int. Cl.⁶ .................................................. H01L 21/20
[52] U.S. Cl. ............................ 437/89; 437/90; 437/248; 437/946
[58] Field of Search ............................ 437/248, 233, 437/81, 82, 235, 238, 89, 90, 946

[56] References Cited

U.S. PATENT DOCUMENTS 5,308,788  3/1994  Fitch et al. ........................ 437/946

FOREIGN PATENT DOCUMENTS 1-231936  9/1989  Japan .

Primary Examiner—R. Bruce Breneman
Assistant Examiner—Ramamohan Rao Paladugu
Attorney, Agent, or Firm—Beveridge, DeGrandi, Weilacher & Young

[57] ABSTRACT

In order to form a film on a surface of a semiconductor wafer, a multiplicity of wafers are individually mounted on ring-shaped mounts of a wafer boat, while the temperature within a reaction tube is set at, e.g., 400° C. under a nitrogen gas atmosphere. After loading the wafer boat into the reaction tube, the temperature within the reaction tube is raised up to, e.g., 620° C. at a rate of, e.g., 100° C./min, and SiH₄ gas is supplied onto the surface of a silicon substrate to form a polysilicon film. After film formation, air is forced to flow along the internal surface of the heating section to forcibly cool the interior of the reaction tube. In the case of forming a metal silicon film using a wafer having a silicon substrate and a metal film formed on the surface of the silicon substrate, the temperature within the reaction tube is set at, e.g. 100° C. for loading the wafers. This suppresses the growth of a natural oxidation film and improves characteristics of a semiconductor device. The same principle may apply to an oxide film formation and an impurity dispersion.

13 Claims, 7 Drawing Sheets

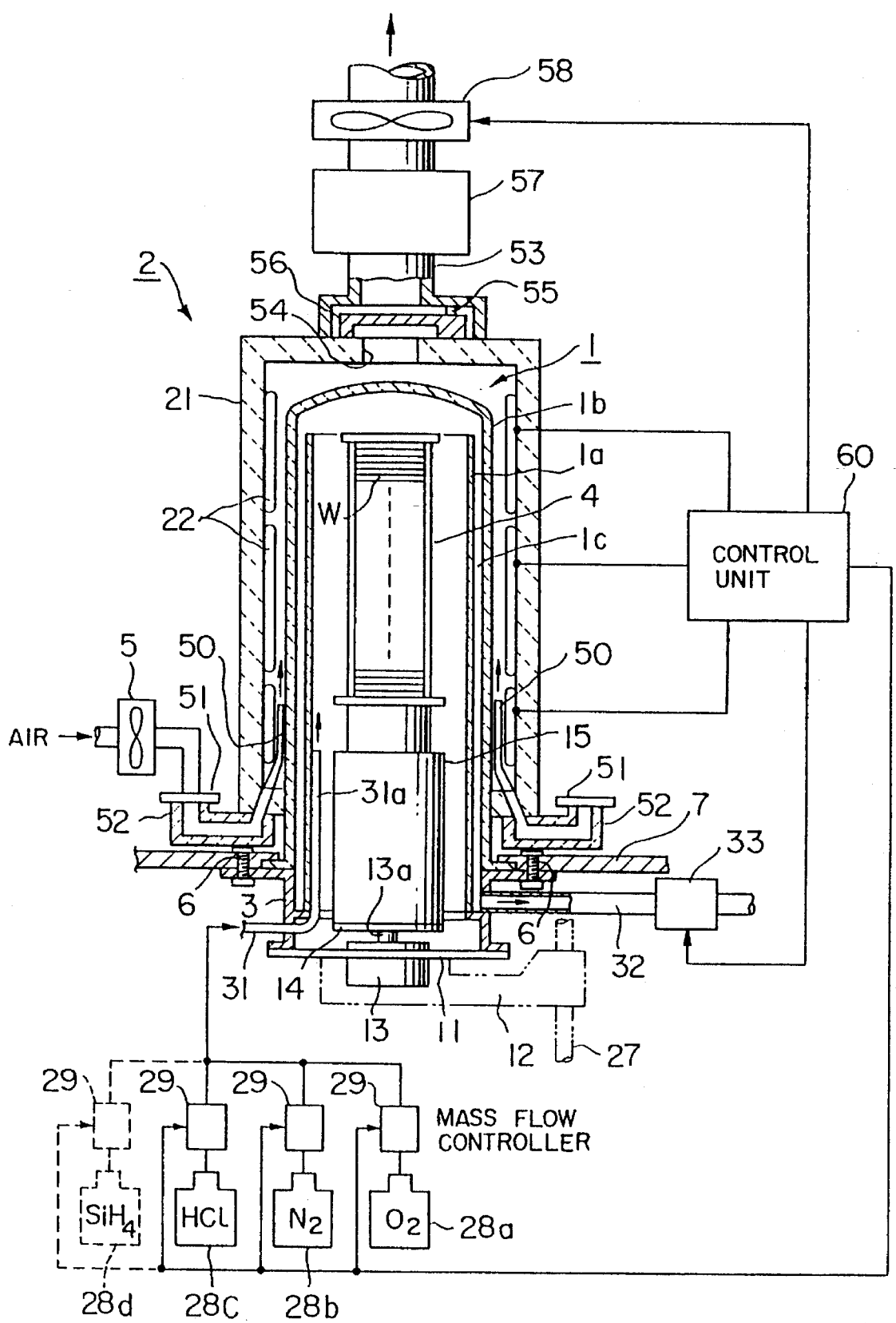
F I G. 1

HEAT TREATMENT PROCESS FOR WAFERS

BACKGROUND OF THE INVENTION

1. Field of the Invention

The present invention relates to a heat treatment process for effecting a film formation, oxidation, impurity dispersion, etc., on a surface of an article to be treated such as a semiconductor wafer.

2. Description of the Related Arts

Among film forming processes for the production of semiconductor devices is a process called a reduced pressure CVD (chemical vapor deposition). This process comprises the steps of introducing a treatment gas into a reaction tube while reducing the pressure within the reaction tube, and forming a film on the surface of a wafer through a chemical vapor-phase reaction. This process is advantageous in that a multiplicity of wafers can be treated at one time because reduced pressure permits the treatment gas to fully enter narrow gaps between adjacent wafers.

As such a batch type film deposition apparatus, much use is recently made of a vertical type heat treatment apparatus because of its small amount of entry of the environmental air. In a conventional reduced pressure CVD process using a vertical type heat treatment apparatus in the case of, for example, forming a polysilicon (polycrystalline silicon) film, a multiplicity of wafers are first mounted on a wafer boat, the reaction tube is filled with a nitrogen gas atmosphere, and the temperature within the reaction tube is raised up to a treatment temperature, for example, of the order of 620° C. The wafers are then loaded into the reaction tube together with the wafer boat. After hermetically closing an opening at the lower end of the reaction tube by means of a closure member, the reaction tube is evacuated for about ten (10) minutes to obtain an atmosphere of a predetermined vacuum. Then, a monosilane ($SiH_4$) gas is supplied into the reaction tube for twenty (20) minutes, for example, to form a polysilicon film on the surfaces of the wafers. Subsequently, nitrogen gas is supplied into the reaction tube for about ten (10) minutes to return the interior of the reaction tube to normal pressure atmosphere. Then, the wafers resting on the wafer boat are unloaded from the interior of the reaction tube.

Among processes for manufacturing semiconductor devices there are an oxidation treatment in which a silicon surface is oxidized at high temperature to obtain an insulating film (oxide film), and a dispersion treatment in which a silicon layer whose surface is implanted with impurities is heated to thermally disperse the impurities into the silicon layer.

As a heat treatment apparatus for carrying out such oxidation or dispersion treatment, use of a vertical type furnace, instead of a horizontal type furnace, is increasing because of its small amount of ingress of the air. In a conventional example of the oxidation treatment by use of a vertical heat treatment apparatus, a multiplicity of wafers are mounted in a wafer boat, the reaction tube is filled with a mixed gas atmosphere of $N_2$ (nitrogen) gas and $O_2$ (oxygen) gas, and the interior of the reaction tube is heated up to a temperature of the order of 800° C., which is lower than the treatment temperature. The wafers are then loaded into the reaction tube together with the wafer boat. After hermetically closing an opening at the lower end of the reaction tube by means of a closure member, the treatment temperature within the reaction tube is raised up to, for example, 900° to 1100° C. at a rate of 10° C./min. This temperature is maintained for a predetermined period of time to form an oxide film on the surface of the silicon layer. Afterwards, the temperature within the reaction tube is lowered to 800° C. at a rate of about 2° C. The wafers resting on the wafer boat are then unloaded from the interior of the reaction tube.

In the impurity dispersion treatment, wafers containing impurity ions, for example, arsenic (As) ions implanted into the surface of the silicon layer of the wafers are held under a heated atmosphere at 900° to 1000° C. and under a $N_2$ atmosphere, to thereby disperse the As ions into the silicon layer. Except for using a different gas atmosphere within the reaction tube, a vertical type heat treatment apparatus can be used in the same manner as in the case of the oxidation.

The conventional heat treatment processes described above involve the following problems.

In the case of film formation treatment, environmental air tends to be drawn in through the opening at the lower end of the reaction tube and enter the interior of the tube although the reaction tube is filled with nitrogen gas at the time of the wafer loading. Because the temperature within the reaction tube is raised up to a treatment temperature of about 620° C., the growth of the natural oxidation film is promoted if the wafers are brought into contact with the oxygen under such high temperature. Therefore, when the reduced pressure CVD is carried out, a natural oxidation film will be formed on an interface between the polysilicon and an underlayer such as monocrystalline silicon film, and the contact resistance between the adjacent films will increase. Since the natural oxidation film is extremely thin, it does not much influence the characteristics of the conventional semiconductor devices. However, because of high integration of the devices in recent years and resultant miniaturization in the width of pattern, the characteristics of the semiconductor devices are much influenced by increased contact resistance caused by the above-described natural oxidation film.

Furthermore, due to a high temperature atmosphere to which the wafers are abruptly subjected during the loading, radiation from the heater surrounding the reaction tube causes the peripheral portions of the wafers to be subjected to a high temperature than the central portion thereof. The resultant thermal strain will cause cracks called "slips" on the surfaces of the wafers.

The treatments to be carried out by the vertical type heat treatment apparatus include a film formation treatment for forming a metal-silicon film by heating a wafer having a metal film such as a Ti film formed on the surface of the polysilicon layer or monocrystalline silicon layer. The above problems also apply to this case because the loading into the reaction tube is effected under a treatment temperature of, for example, 550° to 600° C.

In the case of the oxidation treatment, due to the loading of cool wafers and wafer boat supporting them into the reaction tube, the temperature within the reaction tube is temporarily lowered to a temperature of the order of 700° C. from 800° C. However, the wafers are abruptly subjected to such high temperature during the loading, as in the case of the film formation treatment, the peripheral portions of the wafers are caused to be higher in temperature than the central portion thereof by virtue of the radiation heat from the heater around the reaction tube. The resultant thermal strain therefore causes a shearing deformation called "slip" and warping.

If $O_2$ comes into contact with the surface of the silicon layer at a lower temperature than the predetermined temperature, there will grow on the surface an oxide film having poor film properties, that is, having a low pressure-resistance. Thus, if the wafers are subjected to a range of temperatures lower than the predetermined treatment temperature for a long period of time with a slow heating rate of 10° C./min, there will appear an oxide film having poor film properties, underlying the original oxide film having good film properties, which results in deteriorated film properties as a whole. Without $O_2$ gas supplied into the reaction tube, such problems could be obviated. It is however necessary to supply $O_2$ gas for preventing nitrification since with only $N_2$ gas the silicon layer would be nitrified to roughen the surface.

There is a recent tendency toward the miniaturization and reduction in the thickness of the pattern of semiconductor devices. Because of this tendency, for providing a capacity insulating film, for example, of a CMOS by using the oxidation treatment, the oxide film must be significantly thinned to ensure a large capacity thereof. Thus, the intervening oxide film having poor film properties formed under an atmosphere lower than the treatment temperature will cause a reduction in the yield.

During the loading, the wafers near the top of the wafer boat are exposed to a high temperature in $O_2$ gas atmosphere for a longer period of time than the wafers near the bottom thereof, which will result in an unevenness in the degree of the oxide film formation that depends on vertical positions of the wafers within the wafer boat. The resultant unevenness will possibly influence the characteristics of the semiconductor devices produced.

In the case of the dispersion treatment described above, with the miniaturization of the semiconductor devices, the dispersion depth of the impurities such as arsenic (As) in the silicon layer tends to become smaller to provide a shallow p-n junction. On the other hand, because the concentration profile of impurities within the silicon layer is largely influenced by the thermal history, the concentration profiles of the wafers differ depending on their respective vertical positions within the wafer boat. Consequently, if the wafer boat is abruptly loaded into or unloaded from the reaction tube at a temperature as high as 800° C., the wafers may suffer generation of slips therein described above as well as possible breakage thereof. Therefore, the loading and unloading must be carried out at a slow rate. However, the closer to the top of the wafer boat a wafer is located, the longer becomes the time during which the wafer is subjected to high temperature atmosphere, and the more thermal history the wafer undergoes. As a result, the upper wafers are liable to exhibit a small impurity concentration in the vicinity of the surface and a gentle concentration gradient in its depth direction. Consequently, it becomes difficult for the wafers within the wafer boat to undergo a uniform dispersion treatment.

SUMMARY OF THE INVENTION

The present invention was conceived to solve the above problems, and an object of the invention is to provide a heat treatment process capable of suppressing growth of a natural oxidation film on the surfaces of articles to be treated, such as wafers.

Another object of the present invention is to provide a heat treatment process enabling formation of an oxidation films of good quality on the surfaces of the articles to be treated.

It is a further object of the present invention to provide a heat treatment process permitting the articles to be treated to have a substantially uniform concentration profile.

According to a first aspect of the present invention, there is provided a heat treatment process including the steps of loading articles to be treated into a reaction tube and forming films on surfaces of the articles to be treated within the reaction tube, the process comprising the steps of: before the step of loading articles to be treated, setting within the reaction tube a temperature equal to or below a predetermined temperature capable of suppressing a rapid growth of natural oxidation films on surfaces of the articles to be treated; after the step of loading articles to be treated, rapidly raising the temperature within the reaction tube up to a predetermined treatment temperature; and after the step of loading articles to be treated, supplying a treatment gas into the reaction tube to form a film on a surface of each of the articles to be treated.

According to this heat treatment process, the interior of the reaction tube is maintained at or below a temperature capable of suppressing a rapid growth of a natural oxidation film even if articles to be treated are brought into contact with air that has entered the reaction tube during the loading, whereby any formation of an unnecessary natural oxidation film is reduced in a semiconductor device and the yield is improved.

Furthermore, the temperature within the reaction tube is lowered when loading the articles to be treated, and hence the articles to be treated will be subjected to small thermal strains, whereby any deficiencies which may appear on the surfaces of the articles are suppressed and this contributes to suppress growth of oxidation film having poor film properties during the loading.

Moreover, a rapid rise of temperature within the reaction tube after the loading ensures a suppression of growth of oxidation film having poor film properties, thus resulting in formation of a thinner and superior oxidation film to thereby realize a treatment with a high throughput.

According to a second aspect of the present invention, there is provided a heat treatment process including the steps of loading into a reaction tube articles to be treated each having a silicon layer and an impurity layer formed on the surface of the silicon layer, and dispersing the impurity layer of each of the articles into the silicon layer within the reaction tube, the process comprising the steps of: prior to the step of loading articles to be treated, setting within the reaction tube a temperature equal to or below a predetermined temperature at which each of the articles has a small or short thermal history; and posterior to the step of loading articles to be treated, rapidly raising the temperature within the reaction tube up to a predetermined treatment temperature.

This process enables the articles to be treated to have a small (short) thermal history at the time of loading into the reaction tube, and hence to present a good concentration profile of impurities, thus ensuring a uniform impurity dispersion treatment onto all of the articles to be treated.

BRIEF DESCRIPTION OF THE DRAWINGS

FIG. 1 is a vertical sectional view of a vertical type heat treatment apparatus for carrying out a heat treatment process in accordance with the present invention;

DESCRIPTION OF THE PREFERRED EMBODIMENTS

Figure 2:
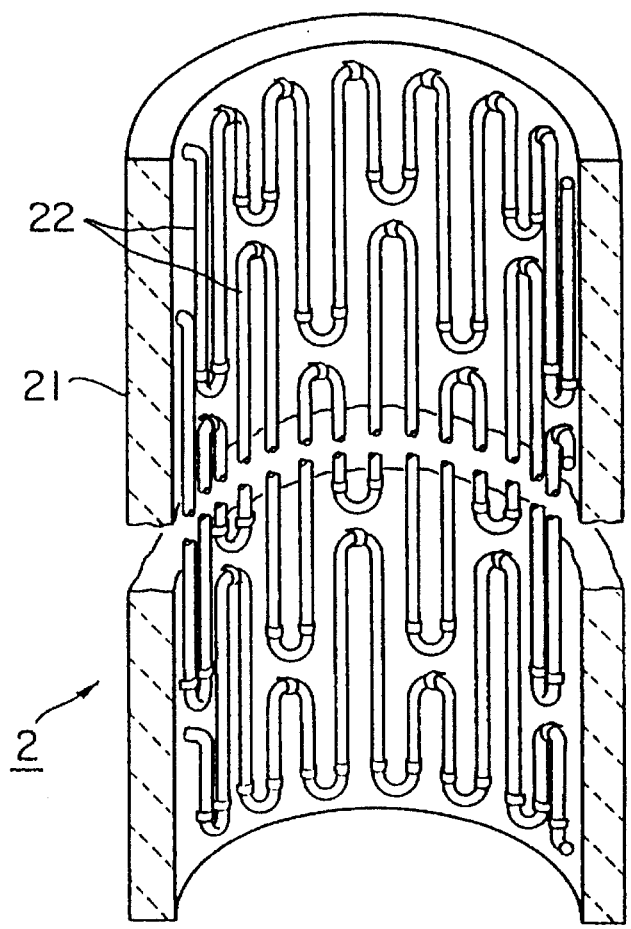
FIG. 2 is a perspective view showing, by way of example, a heating section of the heat treatment apparatus in FIG. 1.
Figure 3:
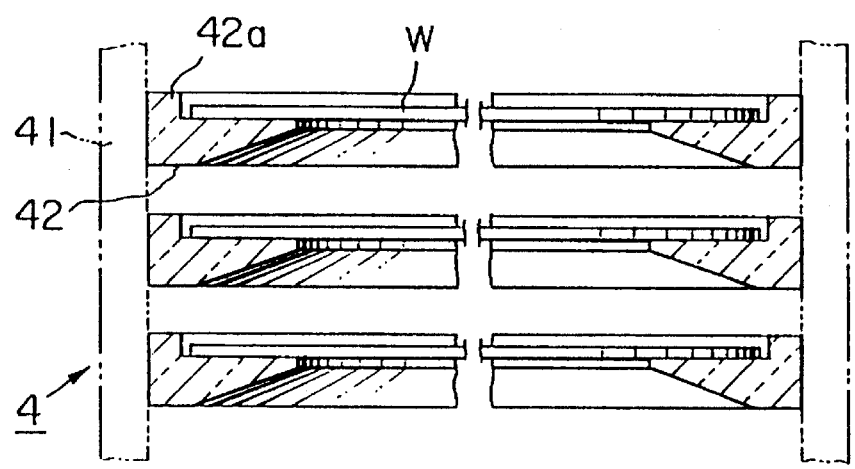
FIG. 3 is a vertical sectional view showing, by way of example, a holder for use in the heat treatment apparatus in FIG. 1.

FIG. 1 illustrates a vertical type heat treatment apparatus for carrying out a film formation process which is one aspect of the heat treatment process in accordance with the present invention. In FIG. 1, a reaction tube generally designated 1 is in the form of a coaxial double tube made of, e.g. quartz and including an inner tube 1a and an outer tube 1b. The inner tube 1a has open upper and lower ends, whereas the outer tube 1b has a closed upper end, the inner 1a and outer 1b tubes defining an annular space 1c therebetween. A cylindrical heating section generally designated 2 is coaxially arranged around the reaction tube 1. The heating section 2, as shown in FIGS. 2 and 3, includes a cylindrical thermal insulator 21 and a resistance heating element 22 supported on the inner surface of the cylindrical thermal insulator 21 and extending in a vertically repeatedly bent manner along its circumferential direction, the thermal insulator 21 being made of plural tiers of heating blocks. The resistance heating element 22 may be an electric heating wire of, e.g., molybdenum desilicide ($MoSi_2$) that enables an increase of temperature in the reaction tube 1 at a rate as high as 50° to 100° C./min.

A tubular metallic manifold 3 is coupled to the lower end of the outer tube 1b in a gastight manner through an O-ring not shown. The manifold 3 associated with the outer tube 1b is secured to a baseplate 7 by means of bolts 6. Passing through the manifold 3 there is provided a treatment gas supply pipe 31 whose part 31a located within the manifold 3 is directed upward in the interior of the inner tube 1a and extends to the vicinity of the lower end of a wafer boat 4, which will be described later. The treatment gas supply pipe 31 can be selectively connected to an oxygen source 28a, a nitrogen source 28b, a hydrogen chloride source 28c, a monosilane ($SiH_4$) source 28d, and other gas sources of supply, by way of their respective mass flow controllers 29, thereby permitting a supply of selected gas. An exhaust pipe having a vacuum pump 33 communicates with the vicinity of the lower end of the annular space 1c.

The amount of heat generated by the resistance heating element 22 is controlled by a control unit 60. The control unit 60 further controls the mass flow controllers 29 associated with the treatment gas sources 28a to 28d.

The opening at the lower end of the manifold 3 can be closed by a closure member 11. The closure member 11 is mounted on an elevator 12 vertically displaceable along vertical guides 27. The closure member, at its upper limit portion, closes the opening at the lower end of the manifold 3. The closure member 11 supports a rotation mechanism 13 having a rotational shaft 13a. On a turntable 14 secured to the rotational shaft 13a is detachably mounted a known wafer boat 4 serving as a wafer holder, through a heat insulating cylinder 15 stuffed with quartz cotton.

The wafer boat 4, by way of example, as shown in FIG. 3, includes four (4) quartz columns 41 circumferentially spaced from and parallel to one another, and thirty (30) ring-shaped mounts 42 made of a material of a large heat capacity such as quartz and firmly fastened to the four columns 41 in a vertically spaced manner, wafers W being individually placed on the mounts 42 in such a manner that the periphery of each of the wafers W comes into contact with an associated mount 42. The ring-shaped mounts 42 each have a peripheral portion 42a slightly raised from the surface of the wafer W so as to shut off heat rays radiated onto the periphery of the wafer W from the surrounding heating section 2. Thus, the outer periphery of the mount 42 becomes thicker gradually than the inner periphery thereof.

As shown in FIG. 1, between the lower end of the heating section 2 and the reaction tube 1 there are provided, e.g., four (4) suction pipes 52 spaced apart from one another in the circumferential direction of the reaction tube 1. Each of the suction pipes 52 opens into the exterior of the apparatus by way of a shutter 51 or communicates with an air supply fan 5. An upwardly directed nozzle 50 is communicatively connected to the inner end of each suction pipe 52. The heating section 2 has at its top an exhaust port 54 leading to an exhaust duct 53 which is provided with a shutter 56, a heat exchanger 57 and an exhaust fan 58, in the mentioned order from the upstream to the downstream side. The shutter 56 is horizontally rotatable about a support shaft 55 in order to open or close the exhaust vent 54. The suction pipes 52 and exhaust ducts 53 function in cooperation as a forced cooling means for forcibly cooling the interior of the reaction tube 1 after the completion of the film formation onto the wafers W.

Figure 4:
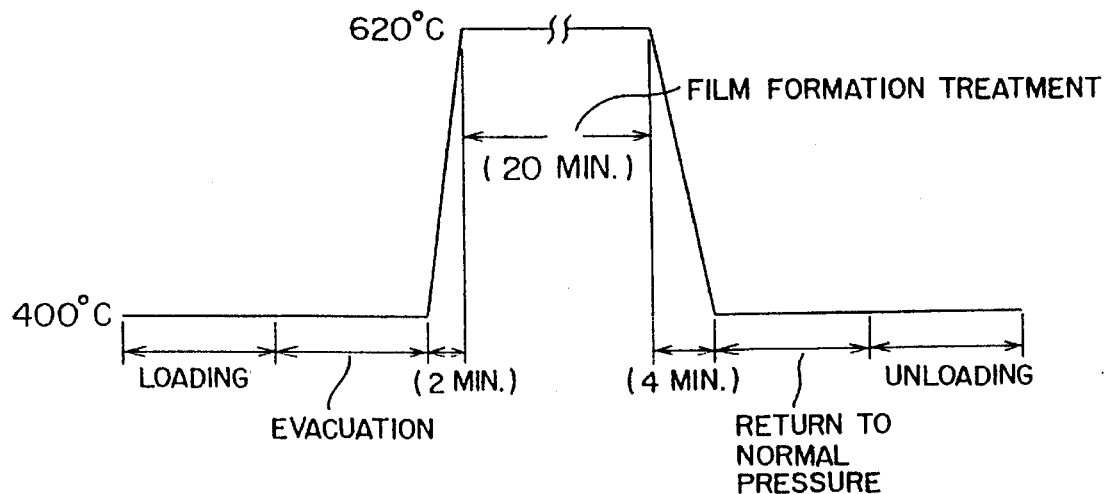
FIG. 4 is an explanatory diagram showing a relationship between process steps and temperatures within a reaction tube in an embodiment of the heat treatment process in accordance with the present invention.

Referring next to FIG. 4, a description will be given of a film formation process using the heat treatment apparatus described above.

First, the temperature within the reaction tube 1 is set at 400° C. through the control of the heating element 22. Under the action of one of the mass flow controllers 29, nitrogen is introduced from the nitrogen source 28b through the supply pipe 31 into the reaction tube 1, thereby filling the interior of the reaction tube 1 with a nitrogen gas atmosphere. Then, e.g., thirty (30) wafers W having a diameter of, e.g., 6 inches are put in the wafer boat 4. The elevator 12 is then raised at a rate of, e.g., 200 mm/min. so that the wafers W can be loaded into the reaction tube 1 through the opening at the lower end thereof. It is to be noted that of the thirty wafers W uppermost and lowermost several ones are used as dummy wafers. The reaction tube 1 is then evacuated for, e.g., about ten (10) minutes through the exhaust pipe 32 by use of the vacuum pump 33 to obtain an atmosphere of a predetermined vacuum. Afterwards, the temperature within the reaction tube 1 is raised up to a temperature of the order of 620° C. at a rate of, e.g., 100° C./min. through the control of the heating element 22 by the control unit 60. Alternatively, the temperature within the reaction tube 1 may be raised at the time of the evacuation.

Figures 5, 6:
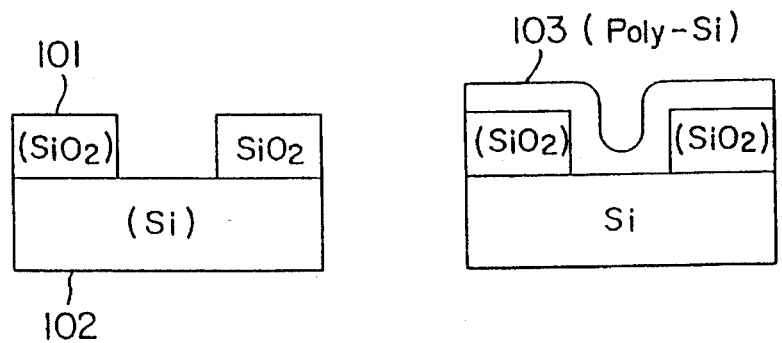
FIGS. 5 and 6 are explanatory representations showing an example of film formation.

Subsequently, the control unit 60 controls the mass flow controller 29 to permit supply of a treatment gas, e.g., $SiH_4$ from the $SiH_4$ source 28d through the gas supply pipe 31 into the reaction tube 1 at a flow rate of 100 cc/min. Simultaneously, the pressure within the reaction tube 1 is kept at, e.g., 0.3 to 1 Torr under control to perform a film formation for 20 minutes, thus forming on a silicon substrate 102 having thereon a pattern 101 of $SiO_2$ film, as shown in FIG. 5, a polysilicon film of 500 angstrom thick, as shown in FIG. 6. Thereafter, the heating operation of the heating element 22 in the heating section 2 is caused to cease, and the shutters 51 and 56 constituting the forced cooling means are opened while the air supply fan 5 and the exhaust fan 58 are actuated. As a result, the air is caused to flow from the nozzles 50 of the suction pipes 52 toward the exhaust port 54 along the inner surface of the heating section 2, thus cooling the reaction tube 1 and its interior. In this manner, the temperature within the reaction tube 1 is lowered to 400° C. at a rate of, e.g., about 50° C./min., and the nitrogen gas is supplied from the source 28b through the gas supply pipe 31 into the reaction tube 1 so as to return its interior to the normal pressure. Then, the elevator 12 is lowered to unload the wafers W. The supply of the nitrogen gas may be initiated either after lowering the temperature within the reaction tube 1 to 400° C. or during the process of lowering the temperature. At unloading, the temperature within the reaction tube 1 may be 400° C. or more. However, the growth of the natural oxidation film is more promoted by the air that has entered the reaction tube 1 as the temperature becomes higher. In order to ensure a uniform cleaning in a cleaning step previous to the subsequent treatment, the growth of the natural oxidation film should be suppressed as much as possible. It is therefore preferable that the temperature within the reaction tube 1 be as low as possible.

According to the process described above, due to the low temperature of 400° within the reaction tube, the growth of the natural oxidation film is suppressed irrespective of possible contact of the wafers W with the air that has entered the reaction tube 1 during the loading, whereby a satisfactory contact between the polysilicon film 103 and the silicon substrate 102 is ensured, to consequently prevent adverse effects on the characteristics of the semiconductor device.

The use of a material having a high heating efficiency, e.g., molybdenum as the resistance heating element 22 of the heating section 2 ensures a rapid rise of temperature within the reaction tube 1 to a treatment temperature at a high rate of 100° C./min. after the loading, which will result in a high throughput.

Since the periphery of each wafer W is retained by the ring-shaped mount 42 made of, e.g., quartz having a large heat capacity, part of heat accumulated in the periphery of the wafer W is allowed to flow into the associated mount 42. Moreover, the mount 42 has a larger thickness along its outer periphery than along its inner periphery, so that a uniform radial distribution of temperature in the wafer W is ensured irrespective of rapid raising and lowering of the temperature of the wafer W. In this manner, the wafers W are loaded at a low temperature and caused to have a uniform in-plane temperature distribution during raising of the temperature, so that occurrence of slip or warp of the wafers can be suppressed.

Figure 7:
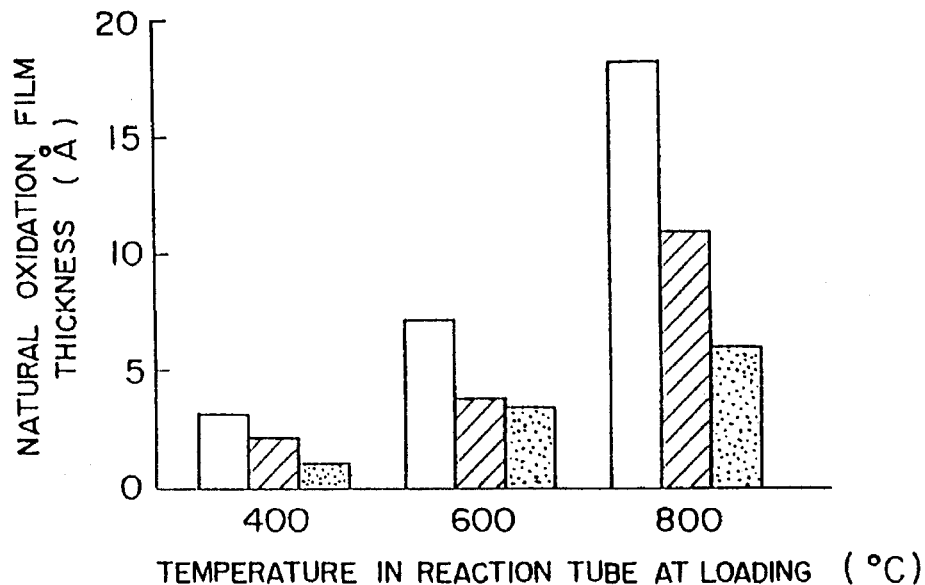
FIG. 7 is a characteristic graph showing a relationship between the thicknesses of natural oxidation films and temperatures within the reaction tube at loading.

The thickness of the natural oxidation film formed on the surface of the wafer W was measured for each of the temperatures of 400° C., 600° C. and 800° C. within the reaction tube 1, under the conditions where the reaction tube 1 was supplied with oxygen from the oxygen source 28a through the gas supply pipe 31 to obtain a 100% $O_2$ gas atmosphere and where the temperature of the wafer boat 4 was raised at a rate of 200° C./min. during the loading. FIG. 7 depicts the results, in which the white frame represents the thickness of the film on the wafer W placed in the top of the wafer boat, the hatched frame represents the thickness of the film in the center of the wafer boat, and the dotted frame represents the thickness of the film in the bottom of the wafer boat. If the film thicknesses corresponding to respective temperatures are joined with lines, respectively, the thickness of the natural oxidation film at any intermediate temperature within the range of 400° to 800° C. can be estimated. This results in an inference that a temperature of 600° C. or below will not greatly influence the characteristics of the semiconductor device. Thus, the temperature within the reaction tube 1 during the loading is preferably 600° C. or below, and more preferably 400° C. or below.

For the formation of the polysilicon film as described above, $Si_2H_6$ gas may be supplied into the reaction tube 1 at a flow rate of, e.g. 100 cc/min. instead of using the $SiH_4$ gas. Furthermore, a doping gas such as $PH_3$ gas, $B_2H_6$ gas, or $AsH_3$ gas may be supplied together with a film forming gas at a flow rate of, e.g., 10 to 200 cc/min. so as to dope the film with impurity such as P, B or As.

This process is conveniently applicable either to a case of forming an amorphous silicon film at a set treatment temperature of, e.g., 550° C., or to a case of forming a SiN film. In the case of forming the SiN film, a pressure of from 0.3 to 0.5 Torr and a treatment temperature of from 660° to 720° C. are employed, and $SiH_2Cl_2$ gas (or $SiH_4$ gas) and $NH_3$ gas are supplied at flow rates of 50 cc/min. and 500 cc/min., respectively, with the nitrogen gas serving as a carrier gas. This results in formation of a SiN film having a thickness of, e.g., 50 to 100 angstrom.

Figure 8:
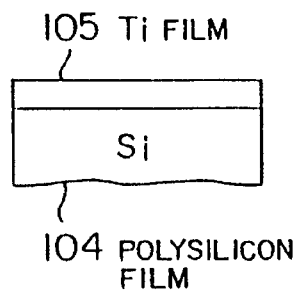
FIGS. 8 and 9 are explanatory representations showing another example of film formation.
Figure 9:
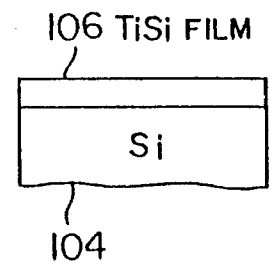

This process is applicable not only to a process for forming a polysilicon film or an amorphous silicon film by means of chemical vapor deposition (CVD), but also to a process in which a substrate having thereon a polysilicon film 104 (or a monocrystalline silicon film) and a metal film, e.g., a Ti film 105 sputtered on the surface of the film 104, as shown in FIG. 8, is subjected to a heat treatment to disperse silicon contained within the polysilicon film 104 into the Ti film 105, as shown in FIG. 9, thereby forming a TiSi film 106 acting as an electroconductive film.

Figure 10:
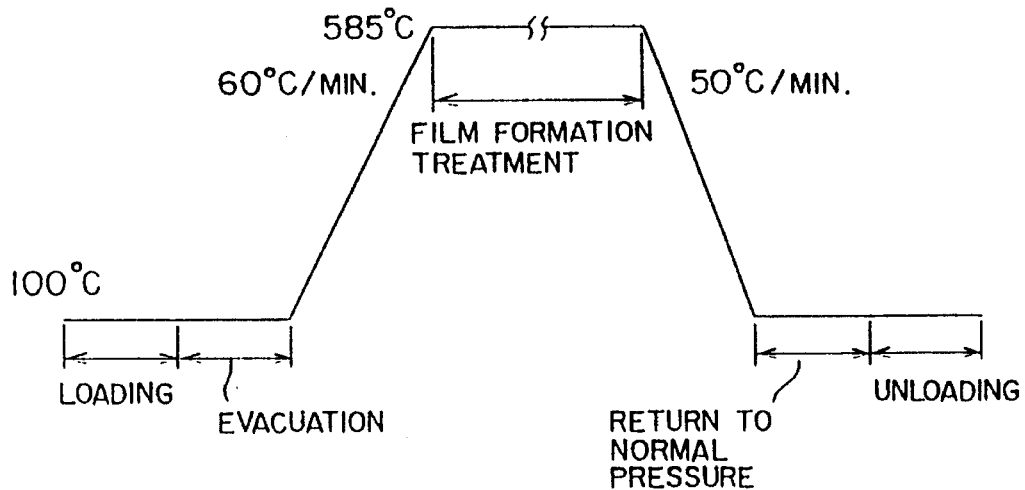
FIG. 10 is an explanatory graph showing a relationship between the process steps and temperatures within the reaction tube in another embodiment of the heat treatment process in accordance with the present invention.

FIG. 10 depicts a relationship between the temperature within the reaction tube 1 and the process steps with the lapse of time from loading to unloading in the case of forming a TiSi film. In this embodiment, the temperature within the reaction tube 1 during the loading, in order to minimize the growth of a metal oxide film required for the surface of the Ti film, is set at 150° C. or below, preferably, 100° C. or below, and after loading is raised up to the treatment temperature at a rate of, e.g., 60° C./min. During the film formation, the treatment temperature is set at 550° to 600° C., preferably, at 585° C., and a vacuum atmosphere of, e.g., 1 Torr is maintained within the interior of the reaction tube 1. Then, nitrogen gas and hydrogen gas are supplied from respective sources at flow rates of 5 lit./min and 0.5 lit./min., respectively, to form a TiSi film having a thickness of, e.g., 2000 to 3000 angstrom. Afterwards, the temperature within the reaction tube 1 is lowered to 100° C. at a rate of 50°C./min. and the pressure is restored to its normal pressure, to effect the unloading of the wafers. Metals for forming such metal silicon film may include Mo, Ta, Zr, Pt and tungsten besides Ti. This process can be applied to a case using a batch processing to form a film other than the films described above.

Figure 11:
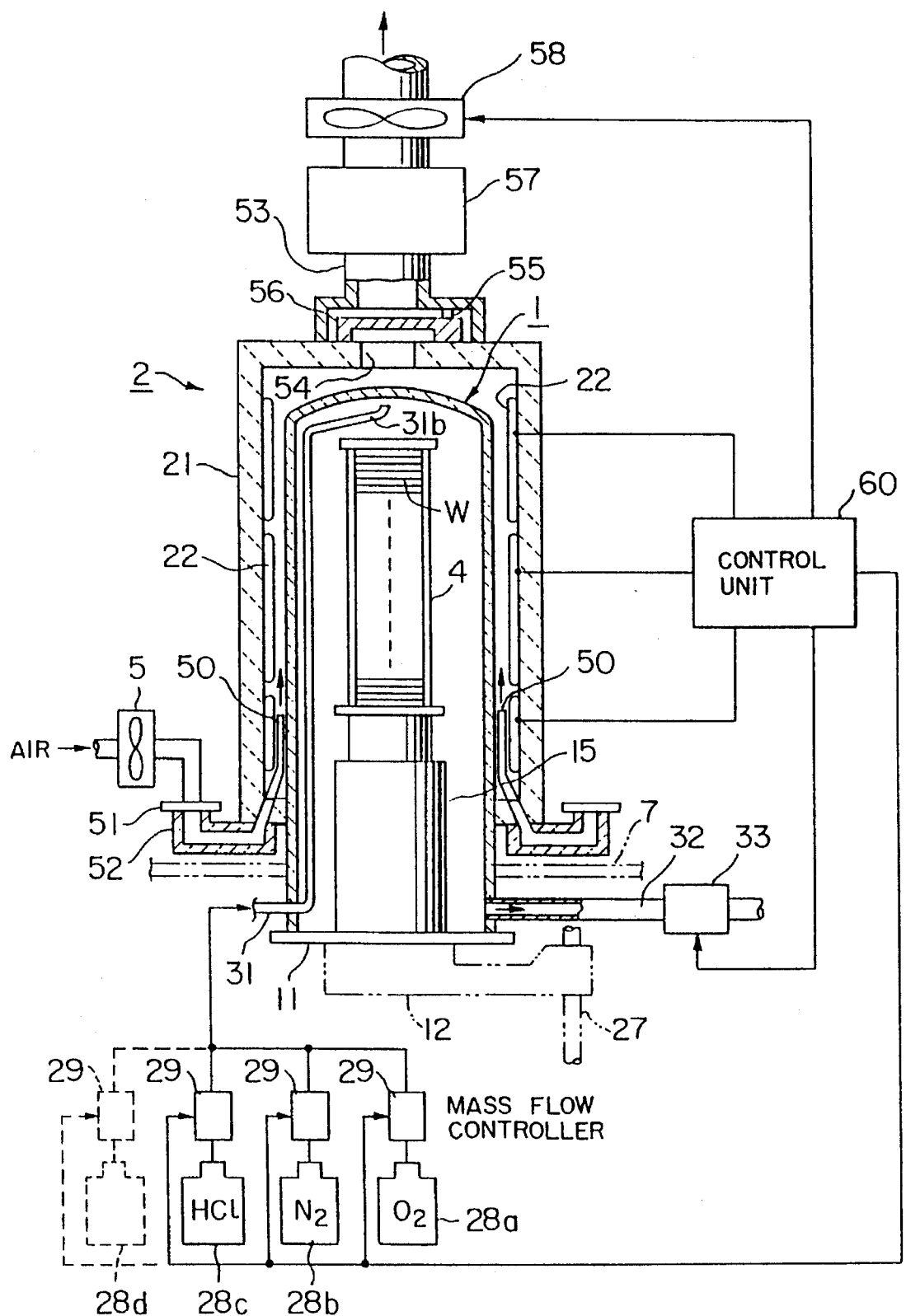
FIG. 11 is a vertical sectional view of a vertical type heat treatment apparatus for carrying out another heat treatment process in accordance with the present invention.

FIG. 11 illustrates another vertical type heat treatment apparatus for carrying out a film formation process which is one aspect of the heat treatment process in accordance with the present invention. Due to the similarity of the heat treatment apparatus shown in FIG. 11 to the FIG. 1 apparatus, like or similar parts are denoted by the same reference numerals, of which description will be omitted, and differences between them will be mainly described.

In the heat treatment apparatus shown in FIG. 11, a reaction tube 1 housed in a heating section 2 is comprised of a single tube, whose lower end is secured to a baseplate 7. The heating section 2, in the same manner as shown in FIGS. 2 and 3, includes a cylindrical thermal insulator 21 and a resistance heating element 22 extending along the inner surface of the insulator 21. In this case, also, the heating element 22 ensures a rise of temperature within the reaction tube 1 at a high rate of 50° to 100° C./min.

A closure member 11 is mounted on an elevator 12 so as to be vertically displaceable. The closure member 11, at its upper limit, is adapted to hermetically close the opening located at the lower end of the reaction tube 1. Onto the closure member 11 is firmly attached a heat insulating cylinder 15 carrying a wafer boat 4 mounted thereon. A treatment gas pipe 31 is connected to a variety of treatment gas sources 28a to 28d through respective mass flow controllers 29. The treatment gas pipe 31 extends upwardly along the inner surface of the reaction tube 1 and has an opening designated at 31b in the vicinity of the top wall of the reaction tube 1. An exhaust pipe 32 having a vacuum pump 33 is coupled to the lower end of the reaction tube 1.

Figure 12:
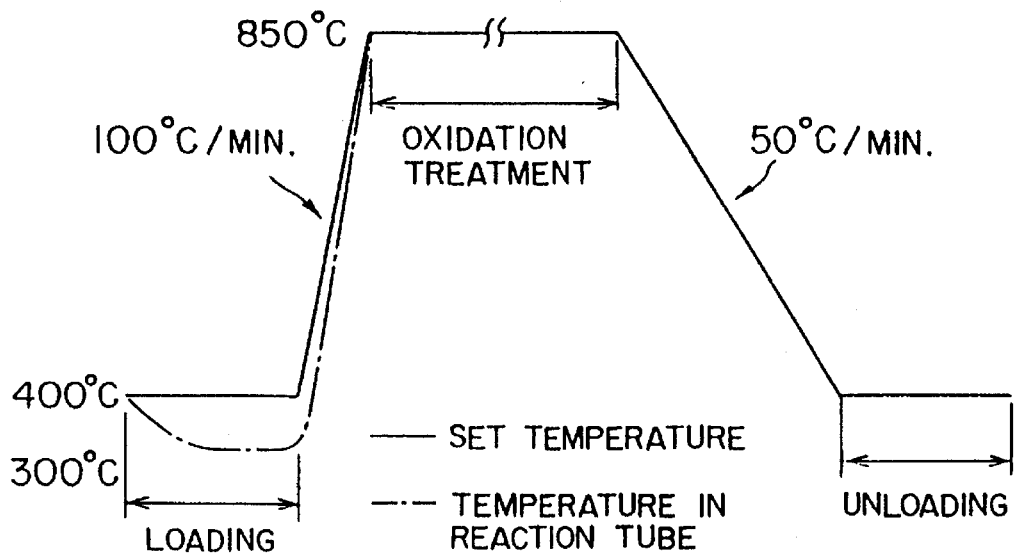
FIG. 12 is an explanatory diagram showing the process steps and temperatures within the reaction tube in the heat treatment process to be executed by the heat treatment apparatus shown in FIG. 11.

Referring now to FIG. 12, a description will be given of a heat treatment process using the heat treatment apparatus described above. First, the temperature within the reaction tube 1 is set at 400° C., and a mixture of $O_2$ gas and $N_2$ gas is supplied through the gas supply pipe 31 into the reaction tube 1. Then, e.g., thirty (30) wafers W each having a diameter of 6 inches are mounted in the wafer boat 4, and the elevator 12 is raised at a rate of, e.g., 200 mm/min. so as to load the wafers W into the reaction tube 1 through the opening at its lower end. Of the thirty (30) wafers, uppermost and lowermost several ones are used as dummy wafers.

Figure 13:
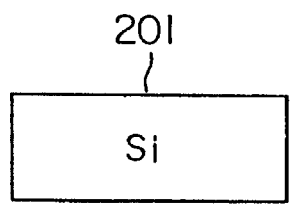
FIGS. 13 and 14 are explanatory representations showing the surface of a semiconductor wafer being oxidized.
Figure 14:
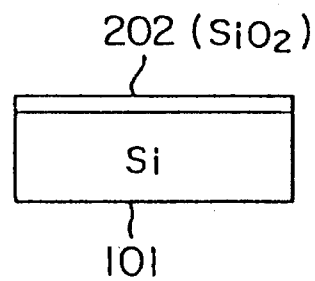

Then, the control unit 60 controls the heating element 22 so that the temperature within the reaction tube 1 is raised up to, e.g., 850° C. to 900° C. at a rate of, e.g., 100° C./min. It is to be appreciated that although the set temperature within the reaction tube 1 is 400° C., the actual temperature within the reaction tube 1 is temporarily lowered to about, e.g., 300° C. due to the loading of the cool wafers W and the wafer boat 4, and thereafter is allowed to rise. Subsequently, the control unit 60 controls the mass flow controllers 29 to permit a supply of $O_2$ gas and HCl gas through the gas supply pipe 31 into the reaction tube 1 at flow rates of 10 lit./min. and 1 lit./min., respectively. An oxidation treatment is thus carried out to form on the surface of a silicon layer 201, as shown in FIG. 13, an oxide film 202 having a thickness of, e.g., 50 to 200 angstrom, as shown in FIG. 14. For the oxidation treatment, 100% $O_2$ gas may be used.

Moreover, instead of such dry oxidation, a wet oxidation using, e.g., $SiO_2$ gas and HCl gas may be employed.

After the oxidation treatment, the heating element 22 of the heating section is deactivated, and shutters 51 and 56 constituting a forced cooling means are opened while an exhaust fan 57 is actuated, whereby the air is caused to flow from nozzles 50 of a suction pipe 52 along the inner surface of the heating section 2 toward an exhaust port 54, thus cooling the interior of the reaction pipe 1. After the temperature within the reaction tube 1 is lowered to 400° C. at a rate of, e.g., 50° C./min. in this manner, the wafers W are unloaded from the reaction tube 1.

According to this process, small thermal stresses occur in the wafer W at the time of loading since the temperature within the reaction tube 1 is set at a temperature as low as 400° C., which will suppress any surface deficiencies called "slips" or warps. The time taken to pass through the temperature range lower than the treatment temperature is shortened by the rapid rise of temperature of 100° C./min., which will shorten the time during which the wafers W are subjected to low temperature, thereby suppressing the growth of the oxide film having poor film properties. As a result of this, there can be obtained a thinner and superior oxide film. When loading and unloading, the closer to the top of the wafer boat 4 a wafer is, the longer becomes the time during which the wafer is subjected to a heating atmosphere. However, since the temperature set within the reaction tube 1 at that time is low, there is very little difference in the degrees of growth of the oxide films, which will lead to a suppression of uneven treatment on the wafers. It is to be understood that the temperature at the time of loading the wafer W into the reaction tube 1 may be raised up to 600° C.

Figure 15:
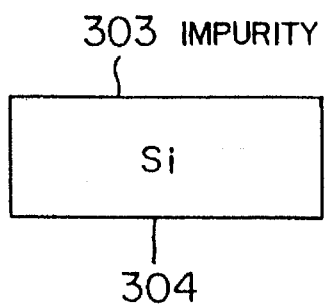
FIGS. 15 and 16 are explanatory representations showing another example of a surface treatment of the semiconductor wafer.
Figure 16:
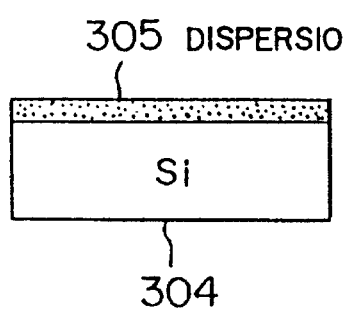

The impurity dispersion treatment will now be described by way of example. First, as an article to be treated, a wafer is prepared having a silicon layer whose surface is implanted with impurities such as, e.g., arsenic (As) ions. In this case, also, e.g., thirty (30) wafers having a diameter of 6 inches including several dummy wafers are mounted in a wafer boat 4 for loading the wafers in the same manner as in the case of the oxidation treatment. Thereafter, the temperature within the reaction tube 1 is raised up to, e.g., 900° to 1000° C. at a rate of 50° to 100° C./min., and $N_2$ gas is supplied into the reaction tube 1 at a flow rate of, e.g., 10 lit./min., thus causing As atoms to be dispersed from an impurity layer, e.g., an As layer 303 on a silicon substrate 304, as shown in FIG. 15, into the silicon layer 304, as shown in FIG. 16, to thereby form a dispersion layer 305.

This process presents an effect that the wafers have a substantially uniform As concentration profile, as well as the effect of suppressing the slips or warps of the wafers in the same manner as the oxidation treatment described above. More specifically, during the loading and unloading, the closer to the top of the wafer boat 4 a wafer is located, the longer becomes the time during which the wafer lies within the reaction tube 1 and therefore the more amount of heat the wafer receives. Nevertheless, since the temperature within the reaction tube 1 at the loading and unloading is set at 400° C., the wafers have a smaller thermal history at this temperature, and thus there is a small difference in the thermal history between the upper wafers and the lower wafers.

Figure 17:
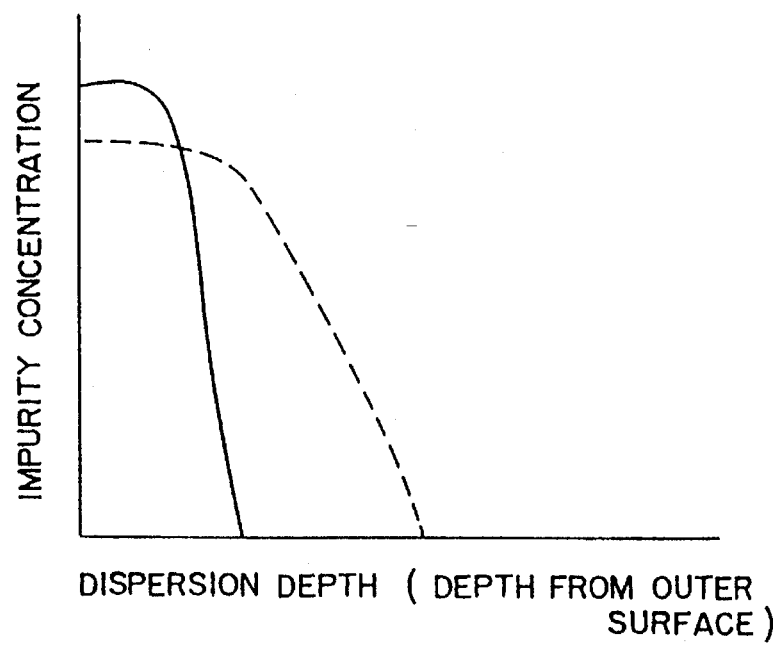
FIG. 17 is a characteristic graph showing a concentration profile of impurity atoms.

Moreover, a uniform rise of temperature which the upper and lower wafers undergo after loading results in a substantially uniform impurity concentration profile among the wafers, from which it can be seen, as indicated by a solid line in FIG. 17, that the surface portion of the silicon layer 304 exhibits a high impurity concentration, and the dispersion depth is small to provide a shallow p-n junction. Incidentally, a broken line in FIG. 17 indicates an example of a poor concentration profile, which will appear when setting the temperature within the reaction tube at 800° C. during the loading and unloading. This comparison demonstrates that the concentration profile can be improved. In view of the suppression of the growth of the natural oxidation film at the loading and the suppression of unevenness in the concentration profiles arising from individual positions of the wafers resting on the wafer boat, the temperature to be set within the reaction tube at the loading is preferably not more than 600° C. The impurities to be dispersed can be, e.g., boron (B) without being limited to arsenic (As).

What is claimed is:

1. A heat treatment process including the steps of loading articles to be treated into a reaction tube and forming films on surfaces of said articles to be treated within said reaction tube, said process comprising the steps of:

before said step of loading articles to be treated, setting within said reaction tube a temperature equal to or below a temperature capable of suppressing a rapid growth of natural oxidation films on the surfaces of said articles to be treated;

after said step of loading articles to be treated, raising the temperature within said reaction tube in a vacuum up to a predetermined treatment temperature at a rate of 50° to 100° C. per minute; and after said step of loading articles to be treated, supplying a treatment gas into said reaction tube to form a film on a surface of each of said articles to be treated.

2. A heat treatment process according to claim 1, wherein:

each of said articles to be treated has a silicon surface, and said temperature is 600° C.

3. A heat treatment process according to claim 1, wherein:

each of said articles to be treated has a silicon surface, and said temperature is 400° C.

4. A heat treatment process according to claim 2, wherein:

said film to be formed on the surface of each of said articles to be treated is a polysilicon film.

5. A heat treatment process according to claim 2, wherein:

said film to be formed on the surface of each of said articles to be treated is an amorphous silicon film.

6. A heat treatment process according to claim 1, wherein:

each of said articles to be treated has a metallic surface and said temperature is 150° C.

7. A heat treatment process according to claim 1, wherein:

said step of loading articles to be treated is effected in such a manner that each of said articles is retained within a holder and said holder prevents heat from being radiated onto each of said articles during loading and after loading.

8. A heat treatment process according to claim 1, further comprising the steps of:

after said step of forming films, rapidly lowering the temperature within said reaction tube to the neighborhood of said temperature; and unloading said articles from the interior of said reaction tube whose temperature has been lowered.

9. A heat treatment process according to claim 1, wherein:

said film formation step is a step of forming an oxide film.

10. A heat treatment process according to claim 9, wherein:

said temperature is 600° C.

11. A heat treatment process according to claim 9, wherein:

said temperature is 400° C.

12. A heat treatment process including the steps of loading into a reaction tube articles to be treated each having a silicon layer and an impurity layer formed on the surface of said silicon layer, and dispersing said impurity layer of each of said articles into said silicon layer within said reaction tube, said process comprising the steps of:

prior to said step of loading articles to be treated, setting within said reaction tube a temperature equal to or below a temperature at which each of said articles has a short thermal history; and after said step of loading articles to be treated, rapidly raising the temperature within said reaction tube in a vacuum up to a treatment temperature at a rate of 50° to 100° C./min.

13. A heat treatment process according to claim 12, wherein:

said temperature is 600° C.

* * * * *